United States Patent
Song et al.

(10) Patent No.: US 8,829,504 B2
(45) Date of Patent: Sep. 9, 2014

(54) WHITE ORGANIC LIGHT EMITTING DEVICE

(75) Inventors: Ki-Woog Song, Joenbuk (KR); Sung-Hoon Pieh, Jeonbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/603,590

(22) Filed: Sep. 5, 2012

(65) Prior Publication Data

US 2013/0069073 A1    Mar. 21, 2013

(30) Foreign Application Priority Data

Sep. 20, 2011    (KR) .................. 10-2011-0094916

(51) Int. Cl.
*H01L 35/24*    (2006.01)
(52) U.S. Cl.
USPC ............................................ 257/40; 257/76
(58) Field of Classification Search
CPC ............ H01L 51/5036; H01L 51/5048; H01L 51/0054; H01L 51/0085; H01L 51/0071; H01L 51/0052
USPC ........... 257/40, 76, 96, 97, 99, 100, 102, 103, 257/440, E51.026, E33.013; 438/28, 29, 438/34, 35, 69, 74, 82, 99; 428/690, 917
See application file for complete search history.

(56) References Cited

U.S. PATENT DOCUMENTS

| | | | | |
|---|---|---|---|---|
| 5,142,343 A | * | 8/1992 | Hosokawa et al. | 257/103 |
| 2003/0091862 A1 | * | 5/2003 | Tokito et al. | 428/690 |
| 2005/0164030 A1 | * | 7/2005 | Knowles et al. | 428/690 |
| 2006/0134461 A1 | * | 6/2006 | Huo et al. | 428/690 |
| 2006/0147752 A1 | * | 7/2006 | Lee et al. | 428/690 |
| 2006/0251923 A1 | * | 11/2006 | Lin et al. | 428/690 |
| 2007/0009762 A1 | * | 1/2007 | Hamada et al. | 428/690 |
| 2010/0078631 A1 | * | 4/2010 | Pieh | 257/40 |
| 2010/0133522 A1 | * | 6/2010 | Pieh et al. | 257/40 |
| 2010/0301744 A1 | * | 12/2010 | Osaka et al. | 313/504 |
| 2011/0156059 A1 | | 6/2011 | Reineke et al. | |

FOREIGN PATENT DOCUMENTS

| | | |
|---|---|---|
| KR | 1020080007570 A | 1/2008 |
| KR | 1020100062169 A | 6/2010 |
| WO | 2008/131750 A2 | 11/2008 |

OTHER PUBLICATIONS

Office Action dated Apr. 30, 2013 from the German Patent Office in counterpart application No. 10 2012 216 265.8.
Office Action dated Mar. 31, 2014 from the Korean Patent Office in Korean counterpart application No. 10-2011-0094916.

* cited by examiner

*Primary Examiner* — Yu-Hsi D Sun
*Assistant Examiner* — Christina Sylvia
(74) *Attorney, Agent, or Firm* — Morgan, Lewis & Bockius LLP

(57) ABSTRACT

The white organic light emitting device for improved efficiencies includes an anode and a cathode opposing each other on a substrate, a charge generation layer between the anode and the cathode, a first stack and a second stack interposed between the anode and the charge generation layer, and between the charge generation layer and the cathode, respectively, wherein at least one of a first hole transport layer and a second hole transport layer has a triplet energy level higher than a triplet energy level of the light emitting layer adjacent thereto, and a difference between a triplet energy level and a singlet energy level of 0.01 eV to 0.6 eV.

13 Claims, 8 Drawing Sheets

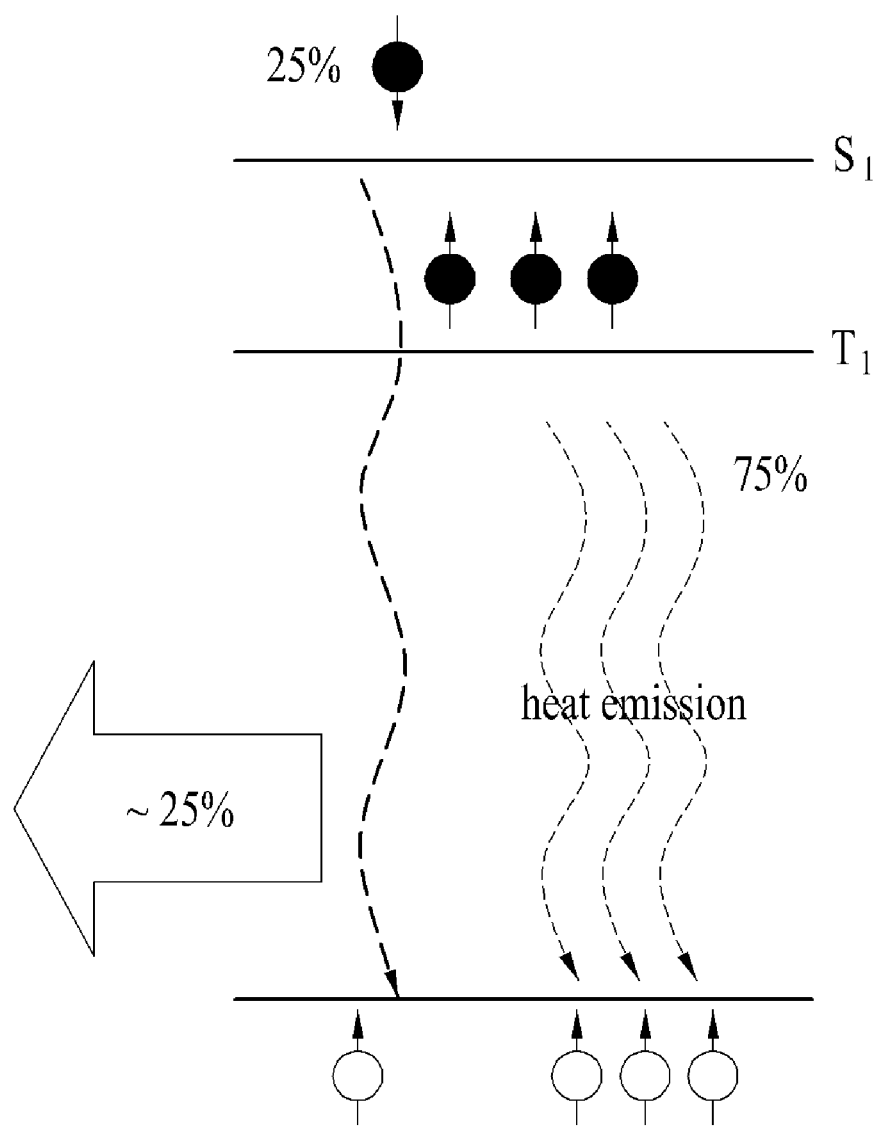

WHITE ORGANIC LIGHT EMITTING DEVICE

This application claims the benefit of Korean Patent Application No. 10-2011-0094916, filed on Sep. 20, 2011, which is hereby incorporated by reference as if fully set forth herein.

BACKGROUND OF THE INVENTION

1. Field of the Invention

The present invention relates to an organic light emitting device. More specifically, the present invention relates to a white organic light emitting device in which efficiency is improved by specifying an energy level of a hole transport layer or a blocking layer adjacent to a light emitting layer.

2. Discussion of the Related Art

The recent trend toward information-dependent age has brought about rapid development in display fields that visually display electrical information signals. In this regard, a variety of flat display devices having superior properties such as slimness, low weight and low power consumption are developed and are actively used as substitutes of conventional cathode ray tubes (CRTs).

Specific examples of flat display devices include liquid crystal display devices (LCDs), plasma display panel devices (PDPs), field emission display devices (FEDs), organic light emitting devices (OLEDs) and the like.

Among them, organic light emitting devices that do not require an additional light source, realize a compact design and render clear color are considered to be competitive applications.

Such organic light emitting devices require formation of organic light emitting layers.

An organic light emitting device rendering white light that is designed by laminating a stack structure including organic light emitting layers having different colors without patterning the organic light emitting layers at respective pixels was suggested.

That is, in white organic light emitting devices, light emitting diodes are formed by depositing layers between an anode and a cathode without using a mask, and organic films including organic light emitting layers are sequentially deposited under vacuum using different materials.

White organic light emitting devices are utilized in various applications including thin light sources, backlights of liquid crystal display, or full-color displays using color filters.

Meanwhile, each stack of conventional white organic light emitting devices includes a hole transport layer, a light emitting layer, and an electron transport layer.

In this regard, in a conventional white organic light emitting device having a configuration in which an electron transport layer is adjacent to the light emitting layer, electrons or excitons generated in the light emitting layer are not used for light emission and are introduced into the hole transport layer. For this reason, luminous efficiency of the light emitting layer is disadvantageously deteriorated.

These conventional white organic light emitting devices have the following problems.

When the triplet energy level of the light emitting layer is similar to that of the hole transport layer, electrons or excitons generated in the light emitting layer are not used for light emission and are introduced into the hole transport layer. For this reason, luminous efficiency of the light emitting layer is disadvantageously deteriorated.

SUMMARY OF THE INVENTION

Accordingly, the present invention is directed to a white organic light emitting device that substantially obviates one or more problems due to limitations and disadvantages of the related art.

It is one object of the present invention to provide a white organic light emitting device in which efficiency is improved by specifying an energy level of a hole transport layer or a blocking layer adjacent to a light emitting layer.

In accordance with one aspect of the present invention, provided is a white organic light emitting device including: an anode and a cathode opposing each other on a substrate; a charge generation layer between the anode and the cathode; a first stack between the anode and the charge generation layer, the first stack including a first hole transport layer, a first light emitting layer emitting blue light and a first electron transport layer; and a second stack, between the charge generation layer and the cathode, the second stack including a second hole transport layer, a second light emitting layer formed by doping single host with a phosphorescent dopant, and a second electron transport layer, wherein at least one of the first hole transport layer and the second hole transport layer has a triplet energy level higher than a triplet energy level of the light emitting layer adjacent thereto, and a difference ($\Delta Est$) between a triplet energy level and a singlet energy level of 0.01 eV to 0.6 eV.

The second hole transport layer may have a triplet energy level that is 0.01 eV to 0.4 eV higher than a triplet energy level of the second light emitting layer and the triplet energy level of the second hole transport layer may be 2.6 eV or more.

The first hole transport layer may have a triplet energy level that is 0.01 eV to 0.4 eV higher than the triplet energy level of the first light emitting layer and the triplet energy level of the first hole transport layer may be 2.6 eV or more.

The band gap energy of the first hole transport layer or the second hole transport layer may be 3.0 eV or more.

The phosphorescent dopant of the second light emitting layer may contain a yellow phosphorescent dopant and a green phosphorescent dopant, or a red phosphorescent dopant and a green phosphorescent dopant, as a combination of different first and second dopants. Alternatively, the phosphorescent dopant of the second light emitting layer may contain only a yellowish green phosphorescent dopant.

The first hole transport layer may further contain a blocking layer adjacent to the first light emitting layer, to prevent introduction of electrons or excitons into the first light emitting layer, or the second hole transport layer may further include a blocking layer adjacent to the second light emitting layer, to prevent introduction of electrons or excitons into the second light emitting layer.

In accordance with another aspect of the present invention, provided is a white organic light emitting device including: an anode and a cathode opposing each other on a substrate; a charge generation layer interposed between the anode and the cathode; and a first stack and a second stack interposed between the anode and the charge generation layer, and between the charge generation layer and the cathode, respectively, wherein the each stack includes a hole transport layer, a blocking layer, a light emitting layer and an electron transport layer, the light emitting layer of the first stack is a blue fluorescence emitting layer and the light emitting layer of the second stack is a phosphorescence emitting layer formed by doping a phosphorescent dopant, and each blocking layer of the first and second stacks has a triplet energy level higher than the adjacent light emitting layer, and a difference between triplet and singlet energy levels of 0.01 eV to 0.6 eV.

Each blocking layer of the first and second stacks may have a triplet energy level that is 0.01 eV to 0.4 eV higher than a triplet energy level of the adjacent light emitting layer. The triplet energy level of each blocking layer of the first and second stacks is preferably 2.6 eV or more.

The band gap energy of each blocking layer of the first and second stacks is preferably 3.0 eV or more.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings:

FIGS. 6A and 6B illustrate a TTA phenomenon of the white organic light emitting device according to the present invention;

DETAILED DESCRIPTION OF THE INVENTION

Reference will now be made in detail to the specific embodiments of the present invention, examples of which are illustrated in the accompanying drawings.

Hereinafter, a white organic light emitting device according to the present invention will be described in detail with reference to the accompanying drawings.

Figure 1:
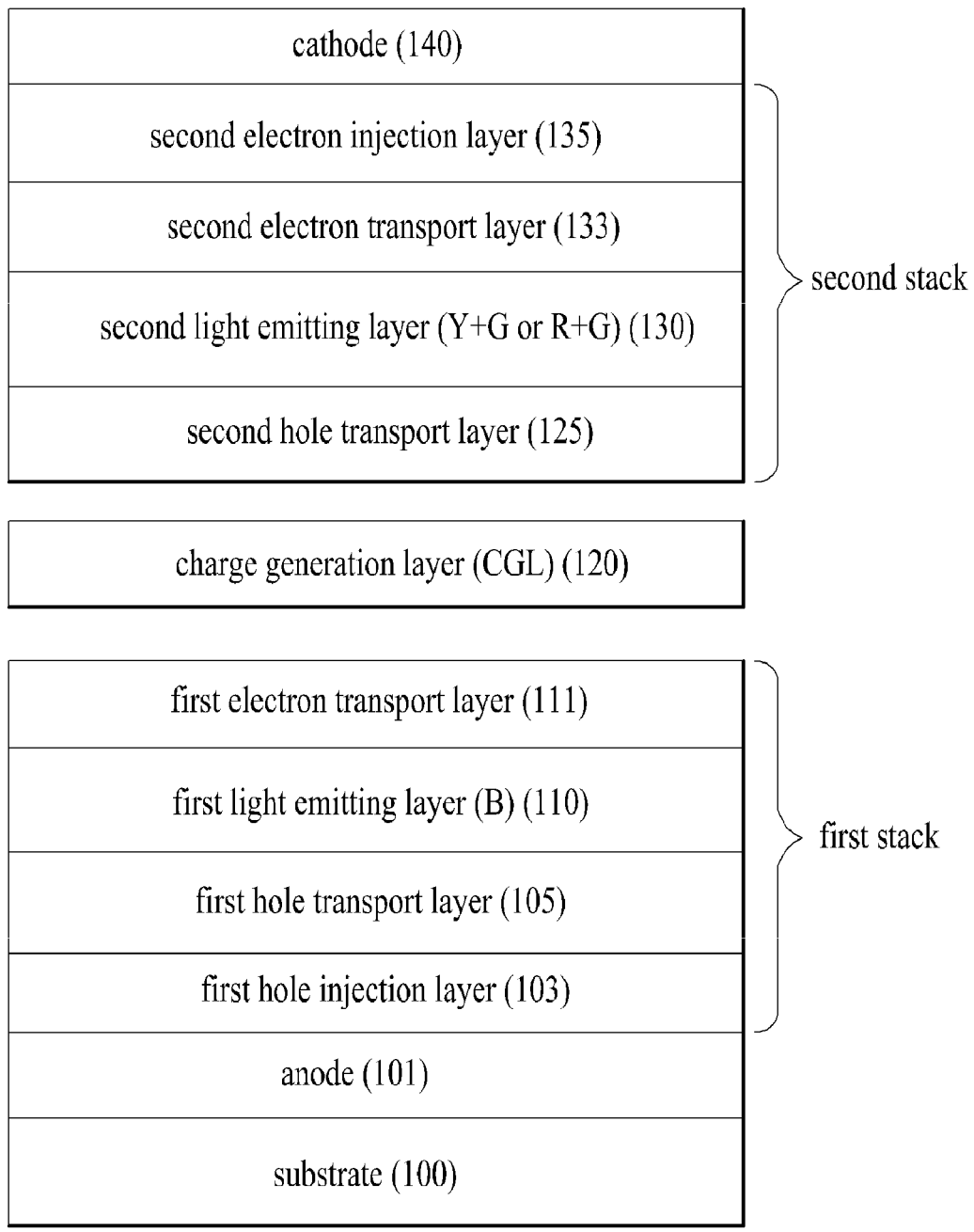
FIG. 1 is a sectional view illustrating a white organic light emitting device according to a first embodiment of the present invention.

FIG. 1 is a sectional view illustrating a white organic light emitting device according to a first embodiment of the present invention.

As shown in FIG. 1, the white organic light emitting device according to the first embodiment of the present invention includes a substrate 100, an anode 101 and a cathode 140 opposing each other on the substrate 100, a first stack laminated between the anode 101 and the cathode 140, a charge generation layer 120 and a second stack.

The anode 101 is formed of a transparent electrode material such as indium tin oxide (ITO) and the cathode 140 is formed of a reflective metal such as aluminum (Al). According to the light emission effects occurring in the first and second stacks based on this configuration, an image is displayed on the bottom based on the illustrated drawing.

The first stack includes a hole injection layer (HIL) 103, a hole transport layer (HTL) 105, a first light emitting layer 110 and a first electron transport layer (ETL) 111 which are laminated between the anode 101 and the charge generation layer 120 in this order, and the second stack includes a second hole transport layer 125, a second light emitting layer 130, a second electron transport layer 133 and a second electron injection layer (EIL) 135 between the charge generation layer 120 and the cathode 140. An electron injection layer (EIL) and a second hole injection layer (HIL) may be disposed under and on the charge generation layer 120, respectively.

The first light emitting layer 110 is a light emitting layer that contains a blue fluorescent or phosphorescent dopant in single blue light host, the second light emitting layer 130 is a single light emitting layer in which different yellow and green phosphorescent dopants are included in single host, or formed by doping red and green phosphorescent dopants. Alternatively, the phosphorescent dopant of the second light emitting layer may contain only a yellowish green phosphorescent dopant.

In this case, during driving of the white organic light emitting device, white light may be realized by mixing blue fluorescence of the first light emitting layer 110 with phosphorescence emitted from the second light emitting layer 130. The color of light emitted from the second light emitting layer 130 may be a combination with other color dopant that is mixed with blue light of the first light emitting layer 110 to render white, in addition to a combination of yellow and green phosphorescent dopants (Y+G), a combination of red and green phosphorescent dopants (R+G), or a yellowish green dopant (YG) to render white.

Also, the charge generation layer 120 interposed between the first stack and the second stack controls charge balance between respective stacks. The charge generation layer 120 has a low optical and electrical loss and metals, oxides, semiconductors, organics and laminations thereof are known as materials used for the charge generation layer 120.

Here, the first hole transport layer 105 and the second hole transport layer 125 are set to have a triplet energy level higher than an energy level of an excited state of triplet excitons (hereinafter, triplet energy level) of the first light emitting layer 110 and second light emitting layer 130. In this case, both the first hole transport layer and the second hole transport layer may be set to have a triplet energy level higher than the triplet energy level of respective adjacent light emitting layer, or one of the hole transport layers may be set to have a triplet energy level higher than the triplet energy level of the adjacent light emitting layer.

In this case, increased energy levels of the first hole transport layer 105 or/and the second hole transport layer 125 are set to be 0.01 to 0.4 eV higher than an energy level of an excited state of triplet excitons of the first light emitting layer 110 and the second light emitting layer 130.

Here, the triplet energy level of the first hole transport layer 105 or/and the second hole transport layer 125 may be 2.6 eV or more. In this case, the first hole transport layer 105 or/and the second hole transport layer 125 preferably have a band gap energy of 3.0 eV or more. Also, by adjusting difference (ΔEst) between a triplet energy level (T1) and a singlet energy level (S1) of the first hole transport layer 105 or/and the second hole transport layer 125 to 0.01 eV to 0.6 eV, external quantum efficiency is improved.

In this case, the first hole transport layer 105 and the second hole transport layer 125 have energy levels higher than the first light emitting layer 110 and the second light emitting layer 130, and the first hole transport layer 105 and the second hole transport layer 125 have a triplet energy level of 2.6 eV or more. Accordingly, it is possible to prevent a phenomenon in which triplet excitons or electrons of the second light emitting layer 130 and the first light emitting layer 110 are introduced into the adjacent second hole transport layer 125 and first hole transport layer 105, thus preventing deterioration in light emission efficiency. That is, the second hole transport layer 125 and the first hole transport layer 105 serve as an exciton blocking layer to perform an inherent function of transporting holes to the second light emitting layer 130 and the first light emitting layer 110, respectively and to prevent introduction of triplet excitons or electrons. In this case, the hole transport layer serving as the blocking layer contains an exiton blocking material.

Also, since the different (ΔEst) between triplet energy level (T1) and singlet energy level (S1) of the first hole transport layer 105 and the second hole transport layer 125 is 0.01 eV to 0.6 eV, although some electrons or triplet excitons are introduced into the hole transport layer, triplet electrons or exitons are readily converted into singlet electrons or exitons based on interaction due to the low different (ΔEst), which are re-diffused to the adjacent light emitting layer and recombined with holes, contributing to light emission. As a result, it is possible to improve efficiency.

Figure 2:
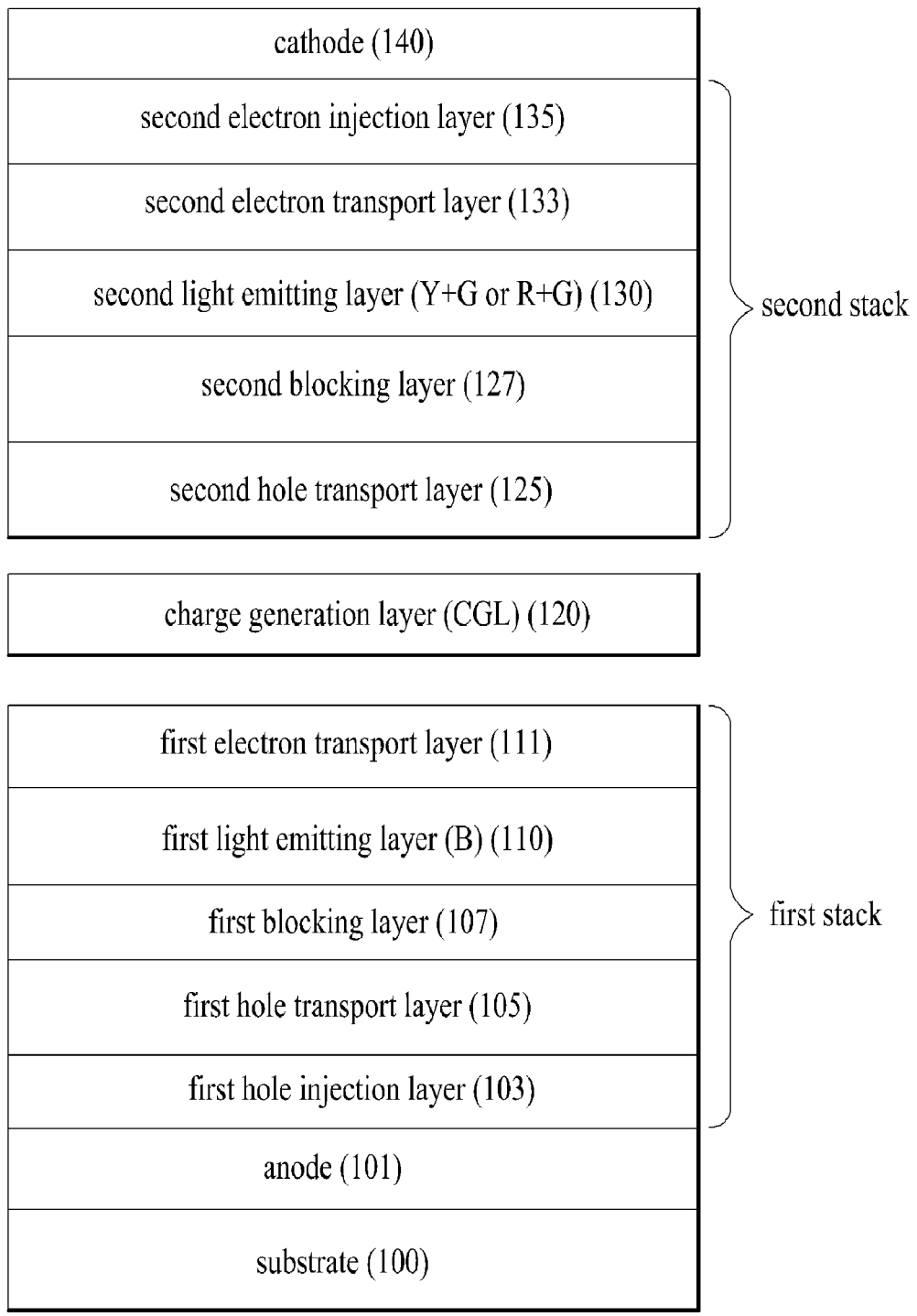
FIG. 2 is a sectional view illustrating a white organic light emitting device according to a second embodiment of the present invention.

FIG. 2 is a sectional view illustrating a white organic light emitting device according to a second embodiment of the present invention.

As shown in FIG. 2, the white organic light emitting device of the present embodiment further includes first and second blocking layers 107 and 127, as separate layers interposed between the light emitting layer and the hole transport layer in each stack to prevent introduction of exitons generated in the light emitting layer or supplied electrons into the hole transport layer.

The white organic light emitting device according to the present embodiment has the same configuration as the aforementioned first embodiment, other than the first and second blocking layers 107 and 127, and a description of the configuration thereof is thus omitted.

Also, both or one of the first and second blocking layers 107 and 127 may be provided. The energy level conditions of the first and second blocking layers 107 and 127 are the same as those of the hole transport layer of the aforementioned first embodiment. In the two embodiments, the layer that is the most adjacent to the light emitting layer performs an identical function to block triplet exitons or electrons or induce re-diffusion of triplet exitions or electrons, introduced into the hole transport layer, into the light emitting layer.

That is, the increased triplet energy level of the first blocking layer 107 or/and the second blocking layer 127 is preferably set to be 0.01 to 0.4 eV higher than an energy level of an excited state of triplet excitons of the first light emitting layer 110 and the second light emitting layer 130.

The triplet energy level of the first blocking layer 107 or/and the second blocking layer 127 may be 2.6 eV or more. In this case, the band gap energy of the first blocking layer 107 or/and the blocking layer 127 is preferably 3.0 eV or more. Also, by adjusting the difference (ΔEst) between a triplet energy level (T1) and a singlet energy level (S1) of the first blocking layer 107 or/and the second blocking layer 127 to 0.01 eV to 0.6 eV, external quantum efficiency is improved.

A method for manufacturing a white organic light emitting device according to the present invention will be described with reference to FIG. 1.

Referring to FIG. 1, in accordance with the method for manufacturing the white organic light emitting device, an anode 101 is formed on a substrate 100.

Then, a first hole injection layer 103, a first hole transport layer 105, a first light emitting layer 110 emitting blue light, a first electron transport layer 111 and an electron injection layer 113 are laminated in this order on the substrate 100 including the anode 101 to form a first stack.

If desired, as shown in FIG. 2, a first blocking layer 107 may be further formed on the first hole transport layer 105.

Then, a charge generation layer (CGL) 120 is formed on the first stack.

Then, a second hole injection layer 123, a second hole transport layer 125, a second light emitting layer 130 obtained by doping red and green phosphorescent dopants in single host, a second electron transport layer 133 and a second electron injection layer 135 are sequentially laminated on the charge generation layer 120 to form a second stack. Like the first stack, in the second stack, as shown in FIG. 2, a second blocking layer 127 may be further formed on the second hole transport layer 125.

Then, a cathode 140 is formed on the second stack.

Here, the second hole transport layer 125 has an energy level of a triplet state higher than an energy level of a triplet excited state of the second light emitting layer 130.

Figure 3:
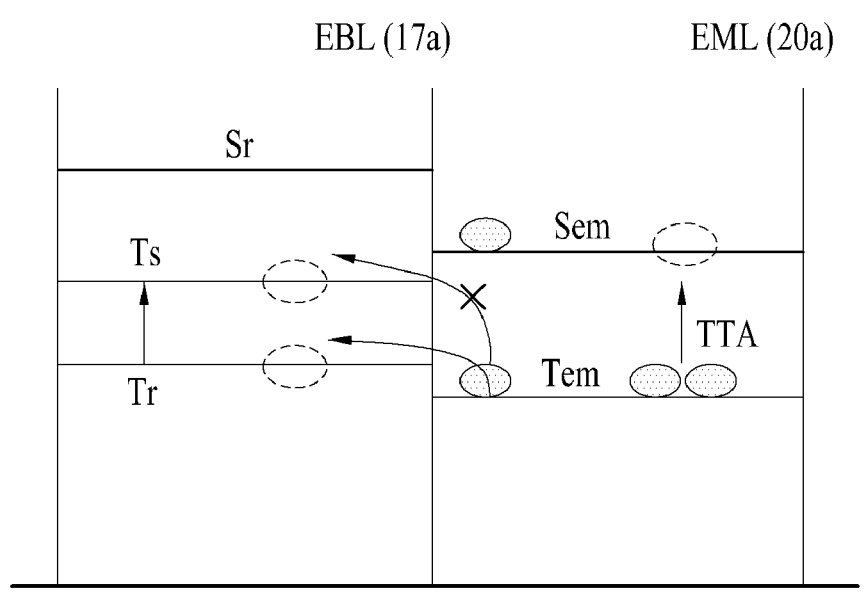
FIG. 3 is a view showing an energy level between layers, when a blocking layer is provided adjacent to a light emitting layer.

FIG. 3 is a view showing an energy level between layers, when a blocking layer is provided adjacent to the light emitting layer.

As shown in FIG. 3, when a blocking layer (EBL) 17a having a high triplet energy is used, the possibility of escape of electrons or excitons from the light emitting layer 20a to the hole transport layer decreases. However, although an organic light emitting device including a blocking layer 17a that has a triplet energy level (Ts) higher than a triplet energy level (Tem) of the light emitting layer 20a is designed, diffusion of electrons or excitons to the blocking layer 17a cannot be completely prevented and electrons or excitons diffused into the blocking layer 17a cannot be thus contributed to light emission and are decayed.

In the drawing, Tr means a triplet energy level that is similar to a generally used triplet energy level (Tem) of the light emitting layer 20a, and Sr and Sem mean singlet energy levels of the blocking layer and the light emitting layer, respectively.

As such, when the blocking layer is provided, introduction of electrons is prevented and efficiency can be thus improved by using a blocking layer having a triplet energy level higher than a triplet energy level of the light emitting layer of the fluorescence device. However, although there is difference in triplet energy, a part of electrons diffuse from the light emitting layer to the blocking layer and, as a result, electrons are lost and do not contribute light emission, thus disadvantageously causing deterioration in efficiency in spite of providing the blocking layer.

In order to solve this problem, the white organic light emitting device of the present invention is designed such that the blocking layer or hole transport layer that is the most adjacent to the light emitting layer has a specific energy level condition and thus exhibits improved efficiency.

Figure 4:
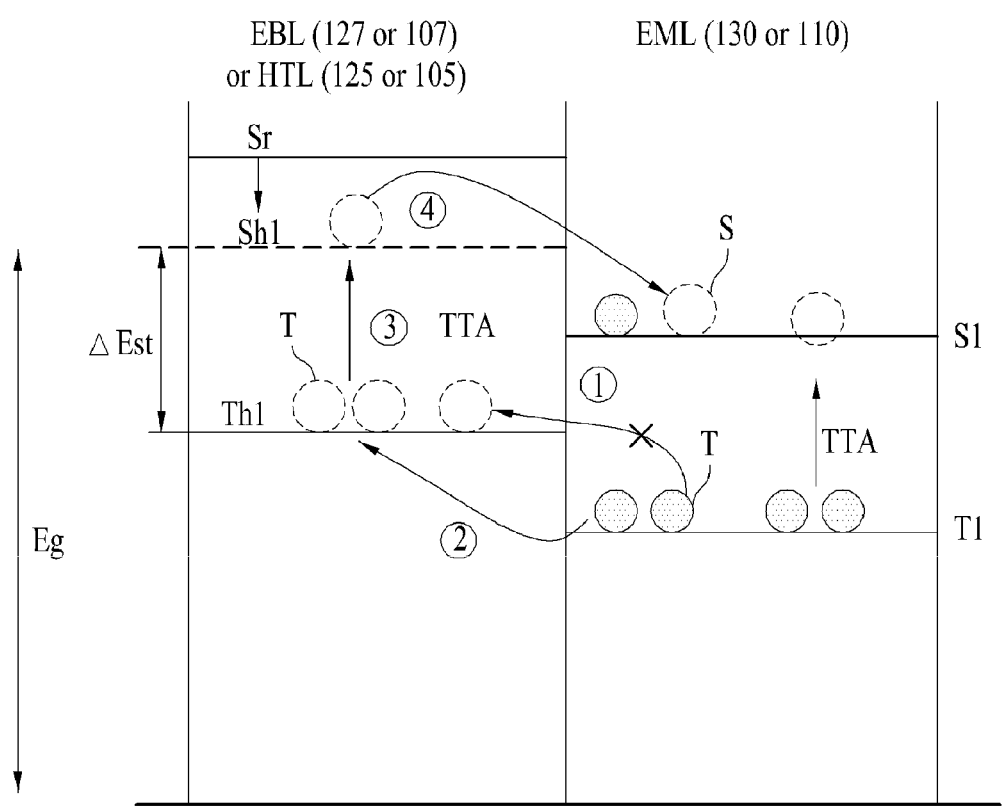
FIG. 4 is a view illustrating action of the hole transport layer or the blocking layer adjacent to the light emitting layer of the white organic light emitting device.

FIG. 4 is a view illustrating action of the hole transport layer or the blocking layer adjacent to the light emitting layer of the white organic light emitting device.

As shown in FIG. 4, in the white organic light emitting device of the present invention, an organic light emitting device structure capable of improving efficiency by controlling a triplet energy level and a singlet energy level through the blocking layer 127 or 107 or hole transport layer 125 or 105 is suggested.

Simply, as shown in FIG. 3, when an electron or exciton blocking layer (EBL) having a high triplet energy level (Ts) is used, it is difficult that the exciton (or electron) blocking layer (EBL) prevents introduction of all electrons from the light emitting layer (EML) to the hole transport layer (disposed at the left of EBL) and electrons are partially introduced from the light emitting layer (EML) to the blocking layer (EBL).

The white organic light emitting device of the present invention is designed such that a blocking layer (or hole transport layer, EBL) has a small difference between triplet and singlet energy levels ($\Delta$Est: $S_{h1}$-$T_{h1}$) and thus functions to recombine electrons or exitons in order to prevent loss of some electrons in the blocking layer (or hole transport layer).

As shown in FIG. 4, the blocking layer (EBL) 127 or 107 or the hole transport layer 125 or 105 that is the most adjacent to the light emitting layer 130 or 110 maintains a high triplet energy level (Th1) and decreases a singlet energy level (Sh1) to reduce a difference between triplet and singlet energy levels ($\Delta$Est), electrons diffused into triplets of the blocking layer (EBL) cause interaction and are thus converted into singlets, and the converted electrons are diffused into the light emitting layer 110 or 130, thus contributing to light emission and improving efficiency. In the drawings, 'S' and 'T' mean a singlet and triplet, respectively.

The white organic light emitting device of the present invention facilitates re-diffusion of electrons or exitons including singlet and triplet to the light emitting layer and thereby improves quantum efficiency of the light emitting layer using a blocking layer 127 or 107 or hole transport layer 105 or 125 having a high triplet energy level and a difference in energy ($\Delta$Est) between triplet level and singlet level of 0.6 eV or less.

Accordingly, the high triplet energy level of the blocking layer 127 or 107, or the hole transport layer 125 or 105 that is the most adjacent to the light emitting layer 130 or 110 enables prevention of introduction of electrons or exitons including triplet or singlet. Based on the small difference between triplet and singlet energy levels ($\Delta$Est), electrons or exitons are readily converted into singlets due to interaction therebetween and the singlet electrons or singlet exitons are diffused into the light emitting layer again, although a part of electrons or exitons are introduced into the blocking layer 127 or 107 or the hole transport layer 125 or 105, thereby contributing to light emission and improving efficiency.

Accordingly, the improvement of efficiency of the light emitting layer, in particular, improvement in current efficiency of stack-structure white organic light emitting devices enables mass-production of large-area white organic light emitting devices (TV products) having a high color temperature and low power consumption.

A light emission phenomenon of the light emitting layer and the neighboring layer thereof in the white organic light emitting device of the present invention will be described.

Figure 5:
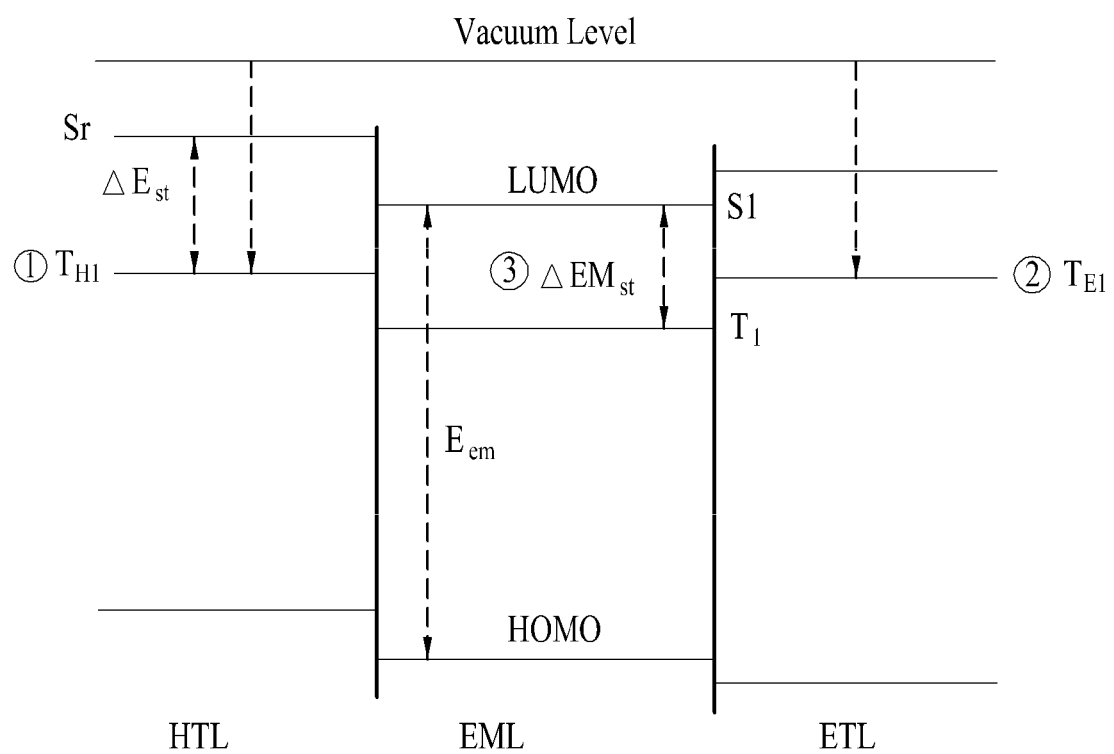
FIG. 5 is a view illustrating energy levels of a hole transport layer (blocking layer), a light emitting layer, and an electron transport layer of a white organic light emitting device of the present invention.
Figure 6B:
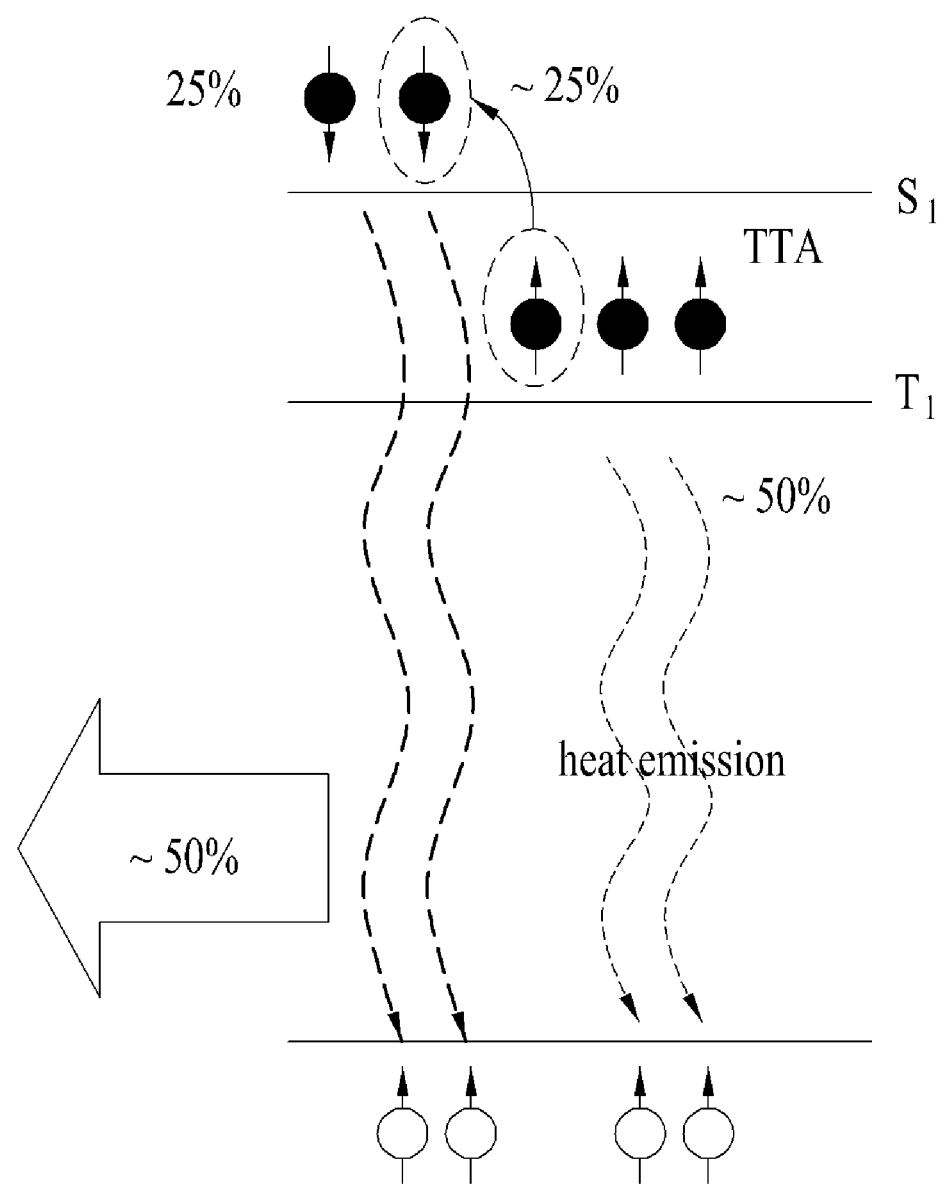

FIG. 5 is a view illustrating energy levels of the hole transport layer (blocking layer), the light emitting layer, and the electron transport layer of the white organic light emitting device. FIGS. 6A and 6B illustrate a TTA phenomenon of the white organic light emitting device according to the present invention.

As shown in FIG. 5, similarly to the case in which the hole transport layer (HTL) (or blocking layer), as the layer that is the most adjacent to the light emitting layer (EML), has a triplet energy level (Th1) higher than a triplet energy level (T1) of the light emitting layer and a small difference ($\Delta$Est) between a singlet energy level (Sh1) and a triplet energy level (Th1), the electron transport layer (ETL) has a triplet energy level (Tel) higher than the triplet energy level (T1) of the light emitting layer (EML) and a small difference between a singlet energy level (Se1) and a triplet energy level (Tel). This aims to inhibit introduction of electrons or exitons from the light emitting layer (EML) into hole transport layer (HTL), and re-diffusion of the electrons from the hole transport layer (HTL) to the light emitting layer, even though partially electrons are introduced from the electron transport layer (ETL) into the hole transport layer (HTL).

In the white organic light emitting device of the present invention, as shown in FIG. 6A, the light emitting layer (EML) fluoresces about 25% of singlet exitons and, as shown in FIG. 6B, for contribution to triplet-triplet annihilation (TTA) caused by delay fluorescence of triplet excitons, a material of the hole transport layer (or blocking layer) or the electron transport layer adjacent to the light emitting layer that has a triplet energy level higher than the host triplet energy level in the light emitting layer (EML) should be selected.

Also, as shown in FIG. 6B, in order to easily convert triplet excitons into singlet exitons through TTA, The triplet-singlet energy level difference ($\Delta$EMst) of the host in the light emitting layer (EML) should be adjusted to within a predetermined level. The reason for this is that it is important to control a triplet-singlet energy level difference ($\Delta$EMst) in order to easily convert triplet excitons into singlet exitons through TTA.

Also, selection of hole transport layer or electron transport layer adjacent to the light emitting layer is important for contribution to TTA. That is, the hole transport layer is selected, while taking into consideration high triplet energy level and HOMO level with an adjacent hole injection layer.

Also, the electron transport layer is selected while taking consideration into high triplet energy and hole blocking property.

Under these conditions, the present invention improves efficiency by applying a phenomenon similar to TTA of efficient light emitting layer to the hole transport layer or the blocking layer adjacent to the light emitting layer.

As shown in FIG. 4, by reducing the difference ($\Delta$Est) between singlet and triplet energy levels of the blocking layer, triplet excitons or electrons diffused into the blocking layer are converted into singlets and the converted exitons or electrons are introduced into the light emitting layer again, thus contributing to light emission and thereby improving efficiency.

As such, the white organic light emitting device of the present invention is designed by applying an idea of TTA effect to improve efficiency of the light emitting layer to the hole transport layer.

Meanwhile, an efficiency mechanism of the white organic light emitting device according to the present invention is as follows.

First, the white organic light emitting device prevents escape of electrons or excitons including singlet or triplet from the light emitting layer (EML) by applying the hole transport layer (HTL) or electron blocking layer (EBL) having a high triplet energy level.

Second, although a triplet energy level difference between the light emitting layer (EML) and the electron blocking layer (EBL) or hole transport layer (HTL) is large, some electrons or exitons are introduced from the light emitting layer (EML) to the blocking layer (EBL) or hole transport layer (HTL) that is the most adjacent to the light emitting layer (EML).

Third, triplet electrons diffused into the electron blocking layer (EBL) or hole transport layer (HTL) cause interaction and are converted into singlet electrons, when a difference (ΔEst) between singlet and triplet energy levels is small.

Fourth, singlet electrons of the electron blocking layer (EBL) or hole transport layer (HTL) are introduced into the light emitting layer, thus contributing to light emission and improving efficiency.

Hereinafter, for description of the effects of the white organic light emitting device according to the present invention, test results using blocking layer materials having energy level properties under various conditions will be described.

In the following description, in the two stack lamination structure shown in FIG. 2, the blocking layer is the most adjacent to one side of the light emitting layer and conditions other than the blocking layer are the same.

Figure 7:
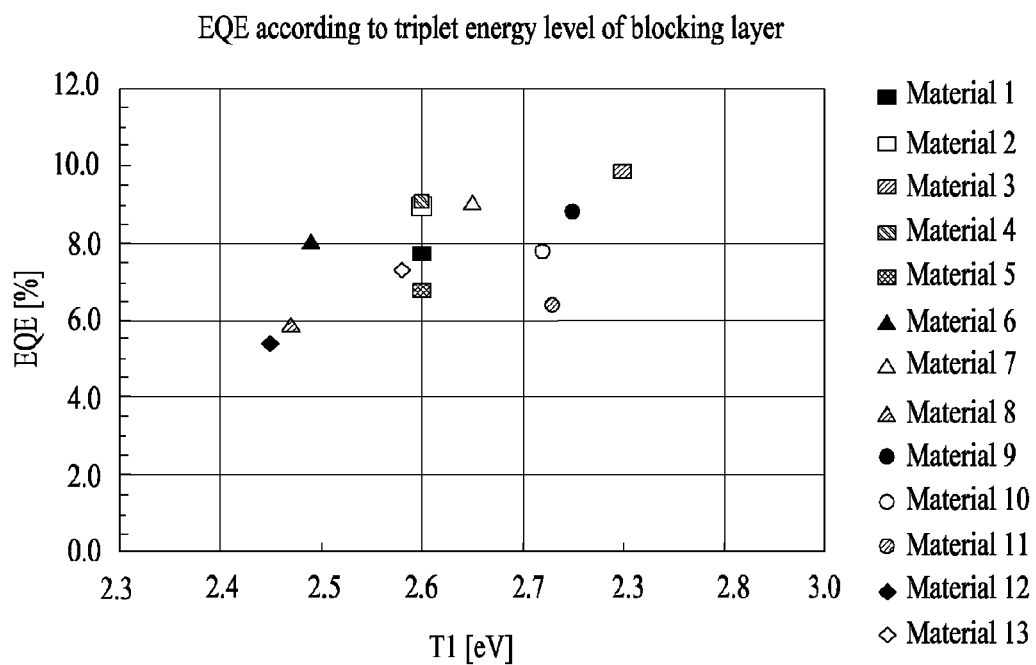
FIG. 7 is a graph showing external quantum efficiency in devices including hole transport layers having different triplet levels and ΔEst, corresponding to Table 1.

FIG. 7 is a graph showing external quantum efficiency in devices including hole transport layers having different triplet levels and ΔEst, corresponding to Table 1.

Referring to the following Table 1 and FIG. 7, when the blocking layer has a triplet energy level of 2.6 eV or less and a singlet-triplet energy level difference (ΔEst) of 0.6 eV or less, external quantum efficiency is about 7.7% or more.

TABLE 1

| Blocking layer material | Band gap energy of blocking layer (eV) | Triplet energy level of blocking layer (eV) | Singlet-triplet energy level difference of blocking layer (ΔEst (eV)) | External quantum efficiency EQE (%) |
|---|---|---|---|---|
| Material 1 | 3.2 | 2.6 | 0.6 | 7.7 |
| Material 2 | 3.1 | 2.6 | 0.5 | 9.0 |
| Material 3 | 3.4 | 2.8 | 0.6 | 9.8 |
| Material 4 | 3.1 | 2.6 | 0.5 | 9.1 |
| Material 5 | 3.2 | 2.6 | 0.6 | 6.8 |
| Material 6 | 3.11 | 2.49 | 0.62 | 8.1 |
| Material 7 | 3.0 | 2.65 | 0.35 | 9.1 |
| Material 8 | 3.03 | 2.47 | 0.56 | 5.9 |
| Material 9 | 3.26 | 2.75 | 0.51 | 8.8 |
| Material 10 | 3.24 | 2.72 | 0.52 | 7.8 |
| Material 11 | 3.29 | 2.73 | 0.56 | 6.4 |
| Material 12 | 2.98 | 2.45 | 0.53 | 5.4 |
| Material 13 | 3.07 | 2.58 | 0.49 | 7.3 |

Materials satisfying the conditions of the blocking layer of the present invention are materials 1 to 5, material 7, and materials 9 to 11. The materials 5 and 11 have relatively different external quantum efficiencies. The reason for this is due to bad properties of the materials. It can be seen that external quantum efficiency increases when a triplet energy level of the blocking layer is high and the singlet-triplet energy level difference of the blocking layer is low.

Meanwhile, as can be seen from the aforementioned tests, singlet energy level and triplet energy level behaviors of the blocking layer (or hole transport layer), band gaps energy (Eg) of the corresponding blocking layer materials of the organic light emitting device of the present invention are 3.0 eV or more. In some cases, the band gap energy corresponding to a HOMO-LUMO difference may be about 3.0 eV, while the blocking layer exhibiting effects is observed in a material that has a band gap energy (Eg) of 3.0 eV or more and satisfies singlet and triplet energy level conditions.

Figure 8:
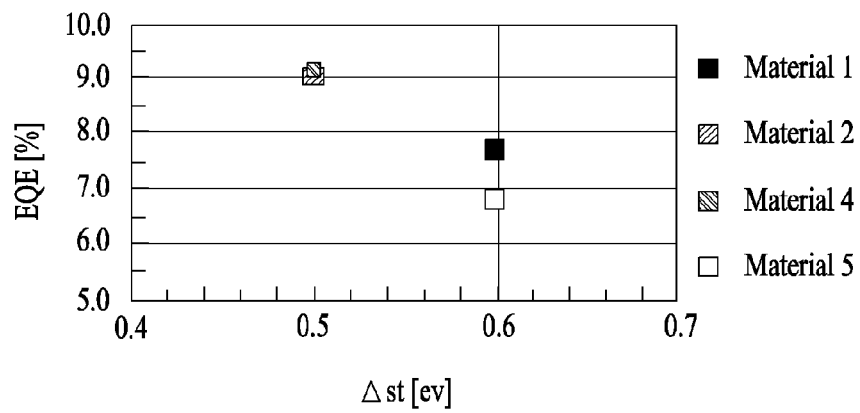
FIG. 8 is a graph showing external quantum efficiency according to variation in ΔEst at a constant triplet level.

FIG. 8 is a graph showing external quantum efficiency according to variation in ΔEst at a constant triplet level.

As shown in FIG. 8, at a constant triplet level of 2.6 eV, as singlet-triplet energy level difference (ΔEst) decreases, an external quantum efficiency is improved. This also demonstrates that external quantum efficiency increases when the blocking layer has a high triplet energy level and a low singlet-triplet energy level difference.

As apparent from the fore-going, the white organic light emitting device of the present invention has the following effects.

The exciton (or electron) blocking layer (EBL) or hole transport layer that is the most adjacent to the light emitting layer is designed to have a triplet energy level higher than a triplet energy level of the light emitting layer and a difference (ΔEst) between a triplet energy level and a singlet energy level lower than 0.6 eV, thus preventing introduction of electrons or exitons from the light emitting layer to the blocking layer (or hole transport layer) and, transporting electrons or exitons from the blocking layer to the light emitting layer again, although the electrons or exitons are introduced into the blocking layer, thereby contributing to production of exitons and improving efficiency of organic light emitting devices.

As such, the white organic light emitting device of the present invention provides an organic light emitting device structure in which an efficiency thereof is improved by controlling a triplet energy level and a singlet energy level.

Accordingly, it is possible to produce a white organic light emitting device with superior efficiency property and thereby mass-produce large-area white organic light emitting devices with high color temperature and low power consumption.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A white organic light emitting device comprising:
   an anode and a cathode opposing each other on a substrate;
   a charge generation layer between the anode and the cathode;
   a first stack interposed between the anode and the charge generation layer, the first stack including a first hole transport layer, a first light emitting layer emitting blue light and a first electron transport layer; and
   a second stack interposed between the charge generation layer and the cathode, the second stack including a second hole transport layer, a second light emitting layer formed by doping one host with a phosphorescent dopant, and a second electron transport layer,
   wherein at least one of the first hole transport layer and the second hole transport layer has a triplet energy level higher than a triplet energy level of the light emitting layer adjacent thereto, and a difference (ΔEst) between a triplet energy level and a singlet energy level of 0.35 eV to 0.6 eV,
   wherein the first hole transport layer has a triplet energy level that is 0.01 eV to 0.4 eV higher than a triplet energy level of the first light emitting layer and, wherein the triplet energy level of the first hole transport layer is 2.6 eV to 2.73 eV and
   wherein the band gap energy of the first hole transport layer is 3.0 eV to 3.4 eV.

2. The white organic light emitting device according to claim 1, wherein the second hole transport layer has a triplet energy level that is 0.01 eV to 0.4 eV higher than a triplet energy level of the second light emitting layer.

3. The white organic light emitting device according to claim 2, wherein the triplet energy level of the second hole transport layer is 2.6 eV or more.

4. The white organic light emitting device according to claim 1, wherein the band gap energy of the second hole transport layer is 3.0 eV to 3.4 eV.

5. The white organic light emitting device according to claim 1, wherein the phosphorescent dopant of the second light emitting layer comprises a yellow phosphorescent dopant and a green phosphorescent dopant.

6. The white organic light emitting device according to claim 1, wherein the phosphorescent dopant of the second light emitting layer comprises a red phosphorescent dopant and a green phosphorescent dopant.

7. The white organic light emitting device according to claim 1, wherein the phosphorescent dopant of the second light emitting layer comprises a yellowish green phosphorescent dopant.

8. The white organic light emitting device according to claim 1, wherein the first hole transport layer further comprises a blocking layer adjacent to the first light emitting layer, to prevent introduction of electrons or excitons into the first light emitting layer.

9. The white organic light emitting device according to claim 1, wherein the second hole transport layer further comprises a blocking layer adjacent to the second light emitting layer, to prevent introduction of electrons or excitons into the second light emitting layer.

10. A white organic light emitting device comprising:
an anode and a cathode opposing each other on a substrate;
a charge generation layer between the anode and the cathode; and
a first stack and a second stack interposed between the anode and the charge generation layer, and between the charge generation layer and the cathode, respectively,
wherein the each stack comprises a hole transport layer, a blocking layer, a light emitting layer and an electron transport layer,
the light emitting layer of the first stack is a blue fluorescence emitting layer and the light emitting layer of the second stack is a phosphorescence emitting layer formed by doping a phosphorescent dopant, and
each blocking layer of the first and second stacks has a triplet energy level higher than that of the adjacent light emitting layer, and a difference between triplet and singlet energy levels of 0.35 eV to 0.6 eV,
wherein each blocking layer of the first and second stacks has a triplet energy level that is 0.01 eV to 0.4 eV higher than a triplet energy level of the adjacent light emitting layer and, wherein the triplet energy level of each blocking layer of the first and second stacks is 2.6 eV to 2.73 eV and
wherein the band gap energy of each blocking layer of the first and second stacks is 3.0 eV to 3.4 eV.

11. The white organic light emitting device according to claim 10, wherein the phosphorescent dopant of the second light emitting layer comprises a yellow phosphorescent dopant and a green phosphorescent dopant.

12. The white organic light emitting device according to claim 10, wherein the phosphorescent dopant of the second light emitting layer comprises a red phosphorescent dopant and a green phosphorescent dopant.

13. The white organic light emitting device according to claim 10, wherein the phosphorescent dopant of the second light emitting layer comprises a yellowish green phosphorescent dopant.

* * * * *